(12) United States Patent
Wu et al.

(10) Patent No.: US 8,852,848 B2
(45) Date of Patent: Oct. 7, 2014

(54) COMPOSITION FOR COATING OVER A PHOTORESIST PATTERN

(75) Inventors: Hengpeng Wu, Hillsborough, NJ (US); Meng Li, Franklin Park, NJ (US); Yi Cao, Clinton, NJ (US); Jian Yin, Bridgewater, NJ (US); DongKwan Lee, Bridgewater, NJ (US); SungEun Hong, Basking Ridge, NJ (US); Margareta Paunescu, Clinton, NJ (US)

(73) Assignee: Z Electronic Materials USA Corp., Somerville, NJ (US)

( * ) Notice: Subject to any disclaimer, the term of this patent is extended or adjusted under 35 U.S.C. 154(b) by 708 days.

(21) Appl. No.: 12/845,236

(22) Filed: Jul. 28, 2010

(65) Prior Publication Data

US 2012/0028195 A1 Feb. 2, 2012

(51) Int. Cl.
   *G03F 7/40* (2006.01)
   *G03F 7/075* (2006.01)
   *C09D 183/08* (2006.01)
   *C09D 183/06* (2006.01)

(52) U.S. Cl.
   USPC ............ 430/273.1; 430/272.1; 430/311; 430/432; 430/453; 106/287.11; 106/287.12

(58) Field of Classification Search
   USPC .................................. 430/270.1–326
   See application file for complete search history.

(56) References Cited

U.S. PATENT DOCUMENTS

| | | | |
|---|---|---|---|
| 3,437,517 A | 4/1969 | Eilemann et al. | |
| 4,491,628 A | 1/1985 | Ito et al. | |
| 5,350,660 A | 9/1994 | Urano et al. | |
| 5,843,624 A | 12/1998 | Houlihan et al. | |
| 6,147,249 A | 11/2000 | Watanabe et al. | |
| 6,274,286 B1 | 8/2001 | Hatakeyama et al. | |
| 6,447,980 B1 | 9/2002 | Rahman et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,361,609 B2 | 4/2008 | Hah et al. | |
| 7,745,077 B2 | 6/2010 | Thiyagarajan et al. | |
| 7,923,200 B2 | 4/2011 | Thiyagarajan et al. | |
| 2001/0012601 A1* | 8/2001 | Fujii et al. ............. | 430/322 |
| 2001/0044070 A1 | 11/2001 | Uetani et al. | |
| 2003/0082389 A1 | 5/2003 | Zhang | |
| 2005/0171277 A1* | 8/2005 | Li et al. ............. | 524/588 |
| 2006/0046205 A1 | 3/2006 | Hah et al. | |

(Continued)

FOREIGN PATENT DOCUMENTS

WO    WO 00/38844 A1    7/2000

OTHER PUBLICATIONS

Shun-ichi Kodama et al., "Advances in Resist Technology and Processing XIX", SPIE vol. 4690, pp. 76-pp. 83, 2002.

(Continued)

*Primary Examiner* — Sin J. Lee
(74) *Attorney, Agent, or Firm* — Sangya Jain

(57) ABSTRACT

The present invention relates to an aqueous composition for coating over a photoresist pattern comprising a first water soluble compound comprising at least a silicon moiety and at least one amino group, and a second compound comprising at least 1 carboxylic acid group. The invention further relates to processes for using the novel invention.

19 Claims, 7 Drawing Sheets

(56) References Cited

U.S. PATENT DOCUMENTS

| | | | |
|---|---|---|---|
| 2006/0063384 A1* | 3/2006 | Hah et al. .................... 438/689 |
| 2006/0193988 A1 | 8/2006 | Walter et al. | |
| 2008/0227028 A1* | 9/2008 | Allen et al. ................ 430/270.1 |
| 2008/0271782 A1* | 11/2008 | Sharma ........................ 136/256 |
| 2009/0095346 A1* | 4/2009 | Hurley et al. ................ 136/256 |
| 2010/0119717 A1 | 5/2010 | Hong et al. | |
| 2010/0297554 A1* | 11/2010 | Watanabe et al. .......... 430/270.1 |
| 2010/0330505 A1 | 12/2010 | Nakajima et al. | |

OTHER PUBLICATIONS

Form PCT/ISA/220, Form PCT/ISA/210, and Form PCT/ISA/237 PCT/IB2011/001756 dated Oct. 14, 2011, which corresponds to U.S. Appl. No. 12/845,236.

* cited by examiner

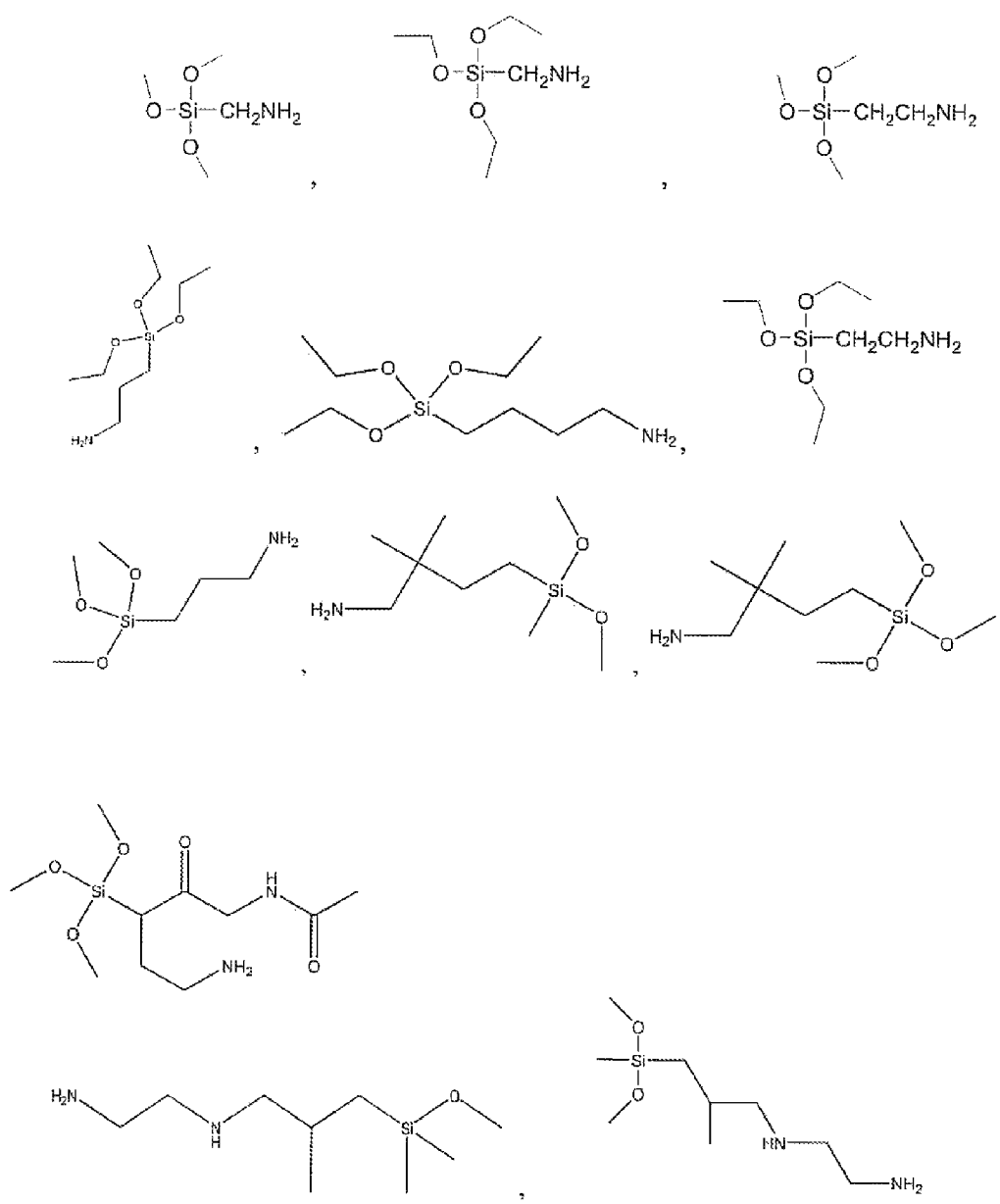
Figure 1. Examples of amino monomers

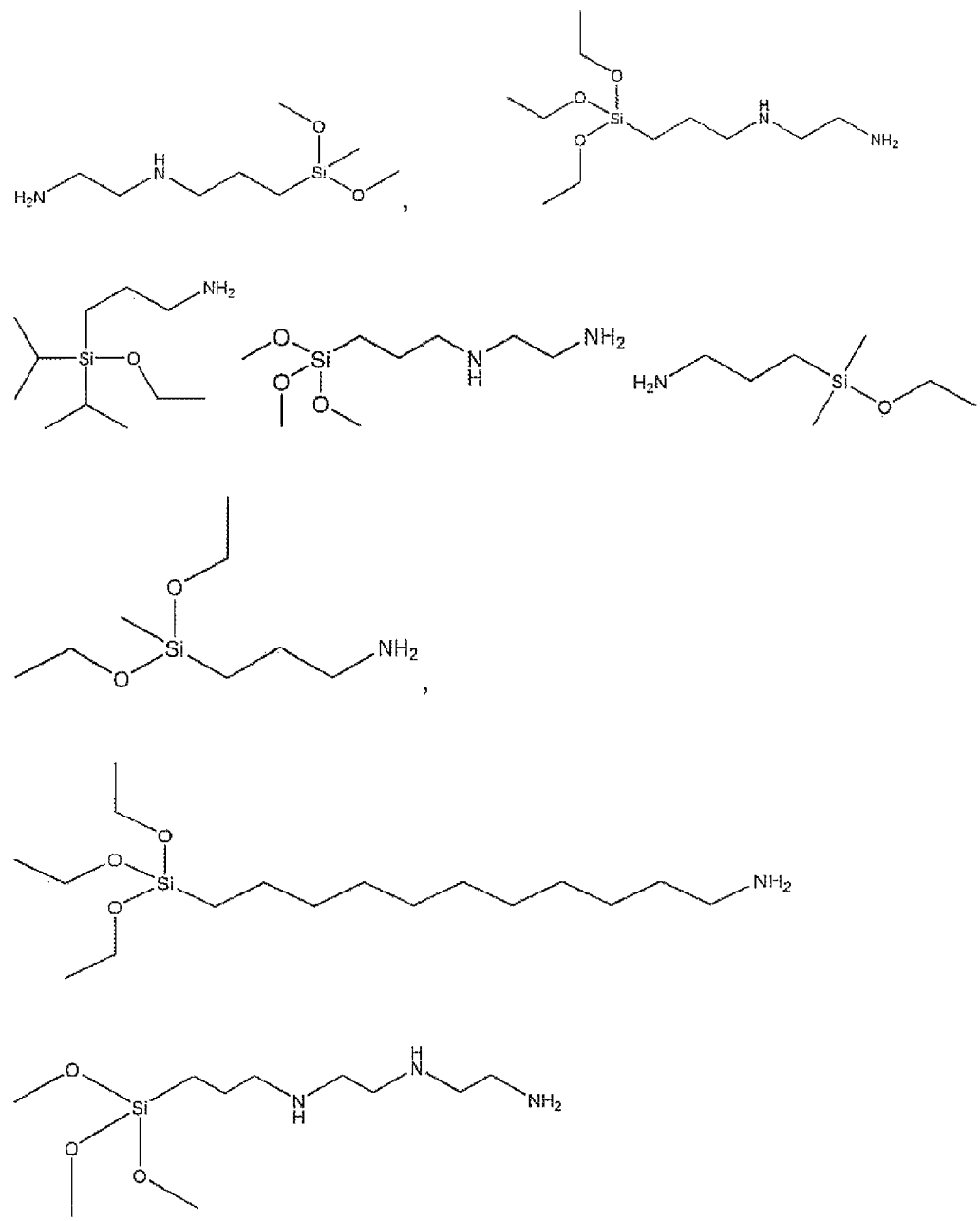
Figure 2. More Examples of amino monomers

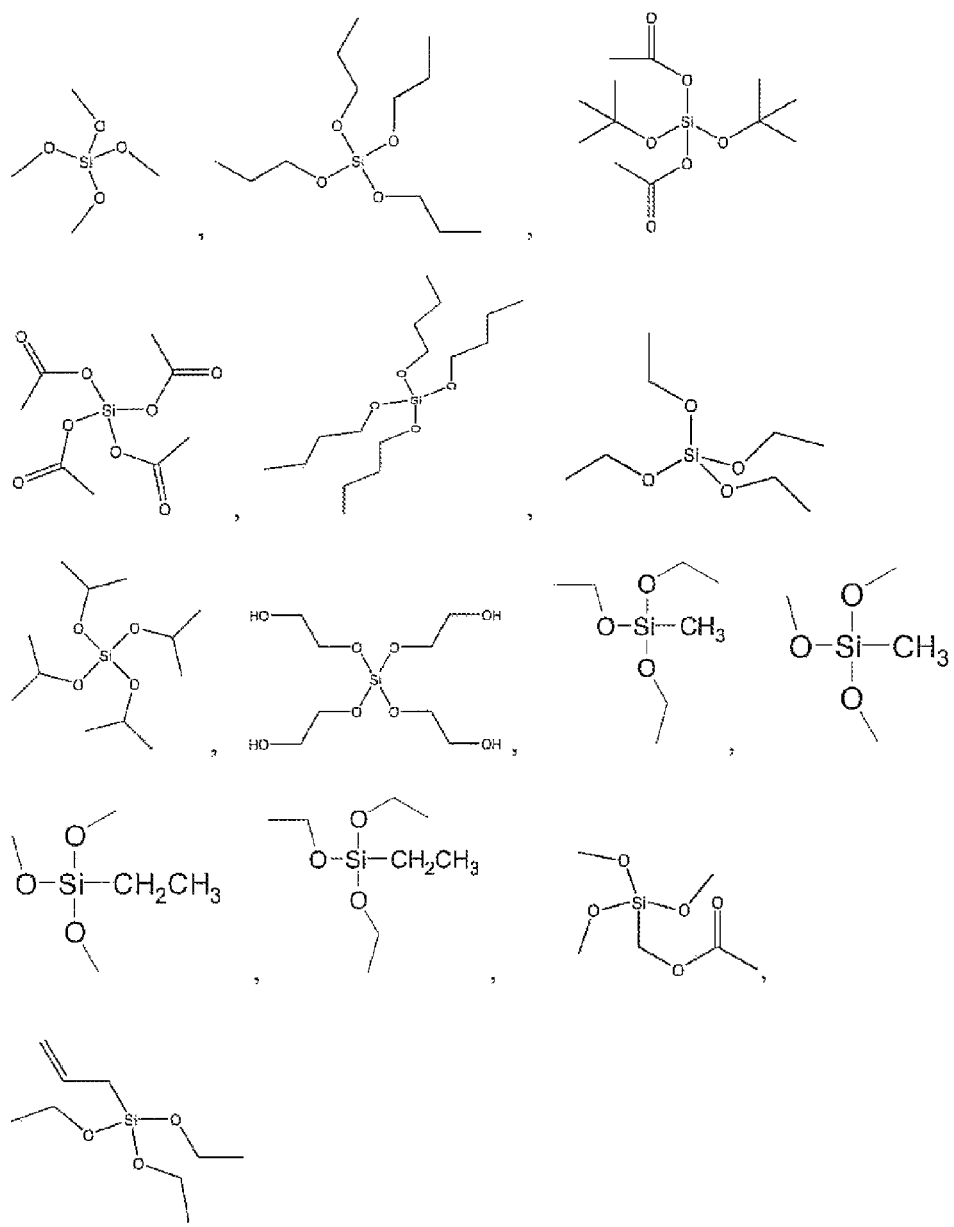
Figure 3: Examples of silicon comonomers

COMPOSITION FOR COATING OVER A PHOTORESIST PATTERN

The present invention relates to a novel composition for coating over a photoresist pattern to improve lithographic performance and also relates to a process for using such a coating for making a pattern on a substrate.

The densification of integrated circuits in semiconductor technology has been accompanied by a need to manufacture very fine interconnections within these integrated circuits. Ultra-fine patterns are typically created by forming patterns in a photoresist coating using photolithographic techniques. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

Miniaturization of integrated circuits requires the printing of narrower and narrower dimensions within the photoresist. Various technologies have been developed to shrink the photoresist dimensions, examples of such technologies are, multilevel coatings, antireflective coatings, phase-shift masks, photoresists which are sensitive at shorter and shorter wavelengths, etc.

One important process for printing smaller dimensions relies on the technique of forming a thin layer on top of the image of the photoresist, which widens the photoresist image but reduces the dimension of the space between adjacent photoresist patterns. This narrowed space can be used to etch and define the substrate or be used to deposit materials, such as metals. This bilevel technique allows much smaller dimensions to be defined as part of the manufacturing process for microelectronic devices, without the necessity of reformulating new photoresist chemistries. The top coating layer or shrink material may be an inorganic layer such as a dielectric material, or it may be organic such as a crosslinkable polymeric material.

Dielectric shrink materials comprise silicon oxide, silicon nitride, silicon oxynitride, spin on material or chemical vapor deposited material. Organic polymeric coatings are where such coatings undergo a crosslinking reaction in the presence of an acid, thereby adhering to the photoresist surface, but are removed where the top shrink coating has not been crosslinked. A method of manufacturing a semiconductor device is where the substrate has a patterned photoresist which is coated with a top layer, the photoresist is then exposed to light and heated so that the photogenerated acid in the photoresist diffuses through the top layer and can then crosslink the top layer. The extent to which the acid diffuses through the top coat determines the thickness of the crosslinked layer. The portion of the top layer that is not crosslinked is removed using a solution that can dissolve the polymer.

The present invention relates to an aqueous coating composition for coating over a photoresist pattern comprising a compound comprising a silicon moiety and an amino group, and a compound comprising a carboxylic acid group. A polymer comprising amino groups is particularly useful for coating over photoresists sensitive to radiation, such as at 193 nm and 157 nm, where the photoresist polymer comprises groups that can react with an amino group. A polymer comprising silicon groups in addition to amino group provides a reactive layer with increased dry etch resistance relative to the photoresist with no silicon. The object of the invention is to form an intermixed layer and/or an attached layer over the imaged photoresist. The intermixed and/or attached layers provide different chemical and physical properties from the photoresist. In one case, due to the presence of silicon moiety, the intermixed and/or attached layers offer under suitable etching atmosphere, sufficient dry etch selectivity or difference between the intermixed and/or attached layers and the photoresist to be useful in many applications, e.g., double patterning. In addition, the intermixed and/or attached layer can stabilize the photoresist pattern and further increases the dimensions of the photoresist pattern. It has been unexpectedly found that the use of this novel coating composition leads to improved pattern definition, higher resolution, stable pattern formation of imaged photoresist and high etch resistance. The novel composition may also be used to dope the surface of the photoresist pattern with silicon moieties diffused from the coating of the novel composition, where such doped surface has a higher dry etch resistance than the undoped photoresist surface.

BRIEF DESCRIPTION OF DRAWINGS

FIG. 1 shows examples of amino monomers.
FIG. 2 shows more examples of amino monomers.
FIG. 3 shows examples of silicon comonomers.

SUMMARY OF THE INVENTION

Figure 4A:
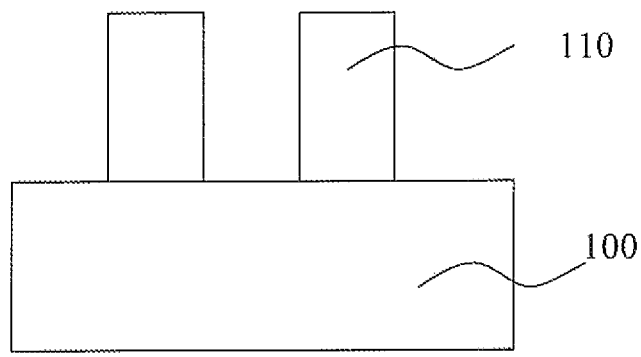
FIGS. 4A to 4F show a process for using the novel composition.

The present invention relates to an aqueous composition for coating over a photoresist pattern comprising a first water soluble compound comprising at least a silicon moiety and at least one amino group, and a second compound comprising at least 1 carboxylic acid group. The invention further relates to processes for using the novel invention.

The invention also relates to an aqueous composition for coating over a photoresist pattern comprising a first water soluble compound comprising at least a silicon moiety and at least one amino group, and a second compound comprising at least 2 carboxylic acid group, where the first compound is given by structure 1,

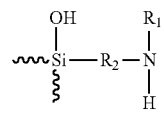

where $R_1$ is selected from hydrogen, $C_1$-$C_8$ alkyl, and $C_1$-$C_6$ carbonylalkyl, $R_2$ is selected from $C_1$-$C_{12}$ aliphatic alkylene, $C_1$-$C_{12}$ carbonylaliphatic alkylene, $C_1$-$C_{12}$ carbonylaminoaliphatic alkylene and $C_1$-$C_{12}$ aminoaliphatic alkylene and ∼∼∼ is the point of attachment to the residual portion of the first compound.

DETAILED DESCRIPTION OF THE INVENTION

The present invention relates to an aqueous silicon coating composition comprising a compound containing at least one silicon moiety and at least one amino group. The amino group is a primary or secondary amino group. The novel composition may further comprise a compound comprising at least one carboxylic acid group or at least 2 carboxylic acid groups.

The invention also relates to a process for manufacturing a microelectronic device, comprising forming a layer of silicon coating material on top of an imaged photoresist pattern, reacting a portion of the coating material near the photoresist interface, and removing the unreacted, soluble portion of the silicon coating material with a removal solution. The removal solution may be water or an aqueous alkaline solution.

The invention also related to a pattern forming method comprising the steps of forming a first photoresist pattern with photoresist structures on a substrate, applying the novel coating composition over the first photoresist pattern to form a coating layer covering the first photoresist pattern, developing the coating layer with a removal solution, thereby forming an attached coating layer over the first photoresist pattern, dry etching the surface of the photoresist to completely remove the attached coating layer on top of the photoresist pattern, and, removing the first photoresist pattern, thereby forming a pattern of the attached layer on the substrate. The removal solution may be water or an aqueous alkaline solution.

The invention also relates to a process for manufacturing a microelectronic device, comprising forming a layer of silicon coating material on top of an imaged photoresist pattern, diffusing the silicon moieties into the photoresist pattern and removing the silicon coating material with a removal solution. The removal solution may be water or an aqueous alkaline solution.

An imaged pattern of photoresist is formed on a substrate according to processes well-known to those skilled in the art.

Photoresists can be any of the types used in the semiconductor industry. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the photoresist composition can transfer from the photomask to the substrate with a high degree of image edge acuity after exposure and development. In many manufacturing applications today, photoresist resolution on the order of less than half micron is necessary. In addition, it is almost always desirable that the developed photoresist wall profiles be near vertical relative to the substrate. Such demarcations between developed and undeveloped areas of the photoresist coating translate into accurate pattern transfer of the mask image onto the substrate. This becomes even more critical as the push toward miniaturization reduces the critical dimensions on the devices.

Generally, a photoresist comprises a polymer and a photosensitive compound. Examples of photoresist systems, without limitation, are novolak/diazonaphthoquinone, copolymers of hydroxystyrene/onium salts, copolymers of capped polyhydroxystyrene/onium salts, cycloaliphatic polymers/onium salts, fluoropolymers/onium salts, etc. These photoresists are well-known for use at wavelengths ranging from 436 nm to 13.5 nm. Any type of photoresist that is capable of forming an image may be used. A photoresist is coated on a substrate, and the photoresist coating is baked to remove substantially all of the coating solvent. The coating is then exposed with the appropriate wavelength of light, and developed with a suitable developer. The generally known technique of nanoimprinting may also be used to form a photoresist image.

Once a photoresist pattern is defined on the substrate, the novel silicon composition of the present invention is coated over the substrate with the photoresist pattern. The coating may be reacted with the surface of the photoresist to form an interface attached layer which is insoluble in the aqueous removing solution. The interface attached layer may be formed either at room temperature (without heating) or by heating the substrate as a suitable temperature for a suitable time. Heating to form the attached layer may be in the range of about 75° C. to about 250° C., or about 80° C. to about 160° C. The amino group of the novel composition reacts with the polymer of the photoresist, where the photoresist polymer contains functionalities that can react with the amino group, such as but not limited to carboxylic acid, lactones, anhydrides and esters. Any acid, such as photogenerated acid, present in the photoresist may assist in the formation of the intermixing and/or attached layer over the photoresist pattern. The unreacted portion of the novel material is removed by the removal solution, thereby forming an intermixing and/or attached conformal layer over the photoresist pattern. The removal solution may be an aqueous solution, such as deionized water or an aqueous alkaline solution, where the alkali may be tetramethylammonium hydroxide.

Figure 4B:
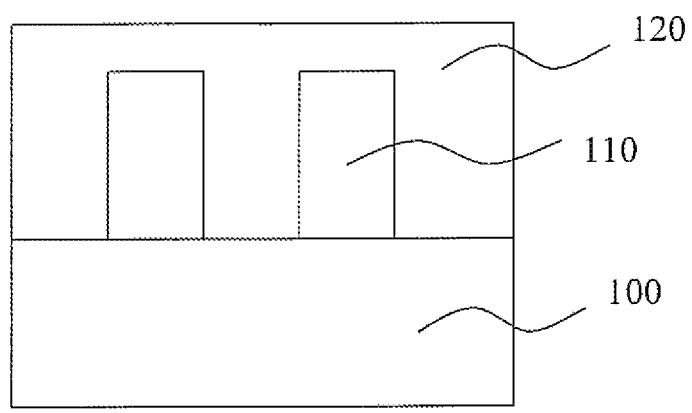
Figure 4C:
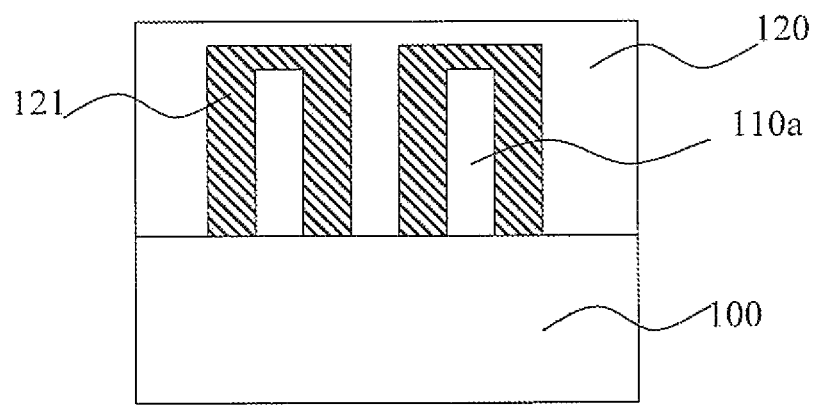
Figure 4D:
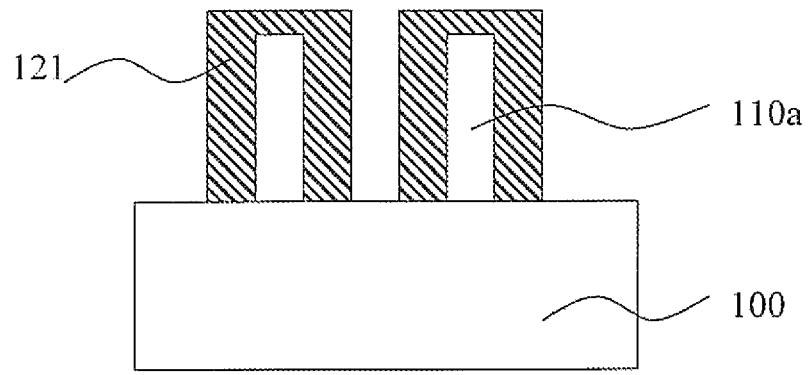
Figure 4E:
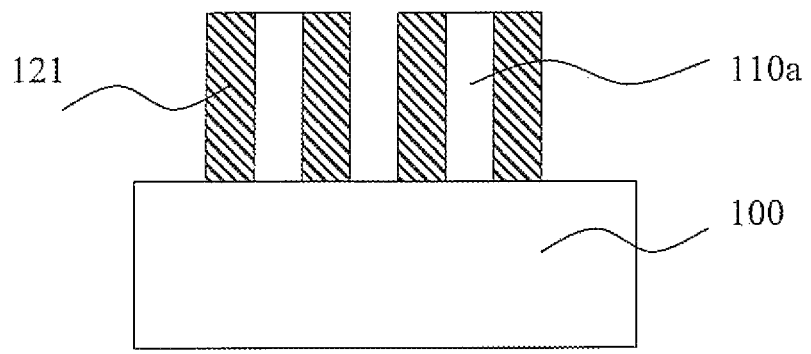
Figure 4F:
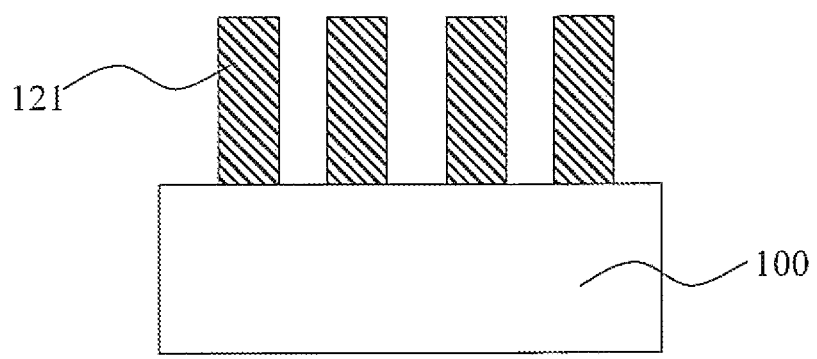
Figure 5A:
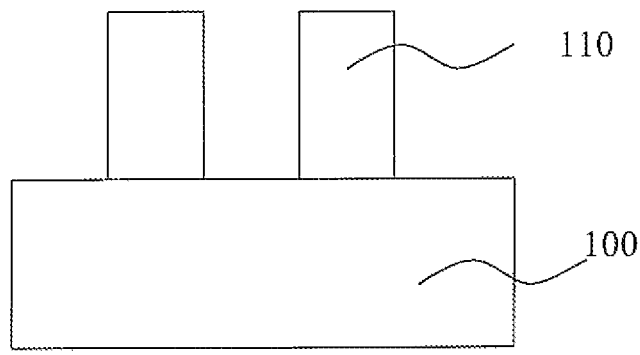
FIGS. 5A to 5D shows another process for using the novel composition.
Figure 5B:
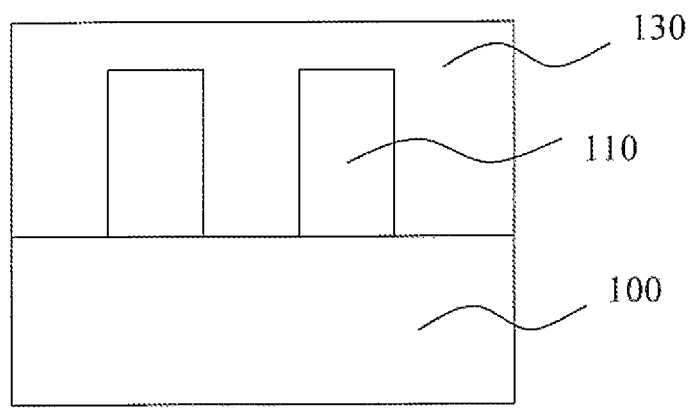
Figure 5C:
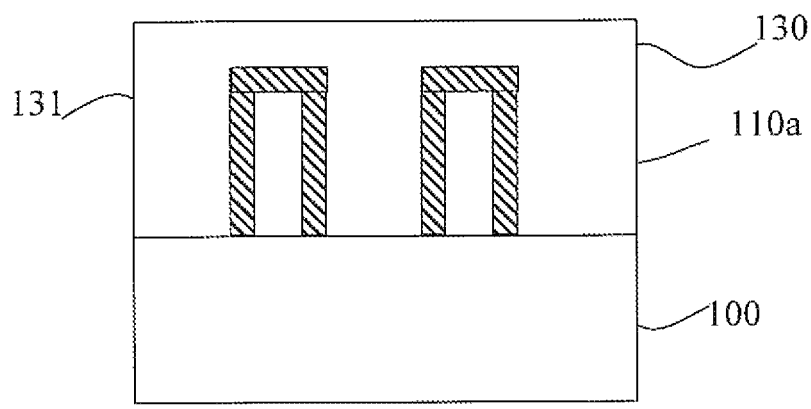
Figure 5D:
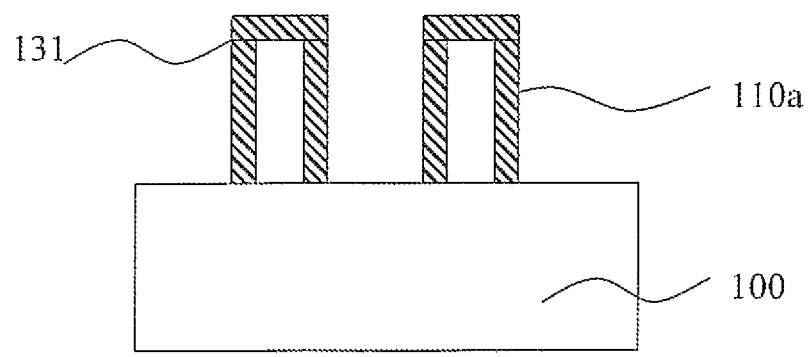

As an example, FIG. 4A to 4F illustrate the process of Positive-tone Self Aligned Double Pattern obtained using the novel coating composition. FIG. 4A shows a resist pattern 110, such as contact hole or trench or line/space, formed on substrate 100. The novel aqueous solution is spin-coated on the resist pattern 110 to form the coating 120, as shown in FIG. 4B. Then, the whole stack of resist pattern 110 embedded in film 120 can be heated at various temperatures from about 75° C. to about 250° C., or about 80° C. to about 160° C., or 110 C to 140 C, for about 60 sec, as shown in FIG. 4C. The attached or intermixed layer, 121, is thus formed. After baking, the excess film 120 can be removed by developing in a removal solution, leaving only an interfacial layer 121 on the surface of resist pattern 110*a*, as shown in FIG. 4D. This remaining interfacial thin layer has contribution from both surface attachment and intermixing with resist material. It has different etch properties than resist pattern and could be used as etch mask. The non-intermixed resist pattern core 110*a* with interfacial layer 121 on the outside can be dry-etched with two step etch. The first step is etch back which removes the layer 121 deposited on the top of resist pattern, leaving the resist 110 exposed to etch gas, as shown in FIG. 4E. The second step is resist removal by using $O_2$ rich etch chemistry. Due to the high etch selectivity of the layer 121 and resist 110 in the $O_2$ etch condition, the resist core 110*a* is removed and leaving a structure derived from the novel coating on the two sides of where the photoresist pattern was, as shown in FIG. 4F. The result of the process is that a final double pattern is formed.

FIGS. 5A-5D illustrate the process of doping the photoresist pattern using the novel material. A photoresist pattern 110 such as contact hole or trench or line/space is formed on substrate 100. The novel aqueous solution 130 is spin-coated on the resist pattern 110. Then, the substrate can be heated at various temperatures from 110 C to 140 C for 60 sec. After baking, the excess novel film 120 can be removed by developing in deionized water (DI water), leaving only a thin interfacial layer 131 on the surface of resist pattern 110. This remaining interfacial thin layer has contribution from both surface attachment and intermixing with photoresist material. By optimizing the components of the novel composition and/or developing in an aqueous alkaline developer instead of DI water, the attachment layer could be optimized to form a very thin layer of less than a few (1-5) nanometers or to a point where the attached layer is removed and only the intermixed doped photoresist surface layer remains. The photoresist pattern can then be used as etch mask in dry etching, since the doped photoresist surface now contains a higher concentration of silicon relative to the updoped photoresist. In this case the dimensions of the photoresist pattern have not changed.

The present novel composition for forming a coating over a photoresist pattern comprises a first water soluble compound comprising at least one silicon moiety and at least one amino group, where the amino group is selected from a primary amino group ($NH_2$) or a secondary amino group (NH). The composition further comprises a second compound comprising at least 1 carboxylic acid group or at least 2 carboxylic acid groups. The silicon moiety in the first compound provides high dry etch resistance relative to only organic compounds containing no silicon, especially relative to the photoresist. The first water soluble compound may be an oligomer or polymer of siloxane (Si—O) or silane (Si—Si) moieties, and further comprising an amino group selected from a primary amine or a secondary amine. An example of the functional group in the first compound is given by structure 1,

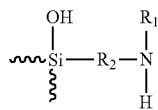

where $R_1$ is selected from hydrogen, $C_1$-$C_8$ alkyl, and $C_1$-$C_6$ carbonylalkyl, $R_2$ is selected from $C_1$-$C_{12}$ aliphatic alkylene, $C_1$-$C_{12}$ carbonylaliphatic alkylene, $C_1$-$C_{12}$ carbonylaminoaliphatic alkylene and $C_1$-$C_{12}$ aminoaliphatic alkylene and ⌇⌇ is the point of attachment to the residual portion of the first compound. In one embodiment $R_1$ is H, $CH_3$, $CH_2CH_3$, $CH_2CH_2CH_3$, and $CH(CH_3)CH_3$. In one embodiment $R_2$ is $CH_2$, $CH_2CH_2$, and $CH_2CH_2CH_2$. The first compound may be prepared by hydrolysis of amino-containing silanes and partial condensation polymerization. Specific examples for the first compound may be poly(aminomethylsiloxane), poly(2-aminoethylsiloxane), poly(3-aminopropylsiloxane). FIGS. 1 and 2 provide examples of the amino-containing silanes that may be used to prepare the first compound of this invention. The first compound may be a co-polymer prepared from a mixture of amino-containing silanes. The first compound may further be a copolymer prepared from amino-containing silanes and non-amino-containing silanes. Examples of non-amino-containing silanes are silanes with substituted and unsubstituted hydrocarbon, substituted and unsubstituted oxyhydrocarbon, substituted and unsubstituted hydrocarbon containing carbonyl, substituted and unsubstituted oxyhydrocarbon containing carbonyl, substituted and unsubstituted hydrocarbon containing carboxyl, substituted and unsubstituted oxyhydrocarbon containing carboxyl, etc. further examples are tetramethoxysilane, methyltriethoxysilane, ethyltriethoxysilane. More examples are shown in FIG. 3.

The novel composition comprises the aminosilane compound of above and a second compound comprising at least one carboxylic acid. Any organic monocarboxylic acid may be used. The organic monocarboxylic may further comprise a silicon group. The second compound may comprise at least 2 carboxylic acid groups, and optionally further comprise a silicon group. The second compound may be water soluble. The second compound alone may not be water soluble, but in the novel composition becomes water soluble. An example of the second compound is given by structure 2,

where W is a connecting group and y is 0, 1, 2 or 3. In one embodiment y is 1, 2 or 3. In one embodiment y is 1. W may be any organic or silicon organic moiety. W can be a hydrocarbon moiety such as is selected from $C_1$-$C_{12}$ aliphatic alkylene, $C_1$-$C_{12}$ carbonylaliphatic alkylene, $C_1$-$C_{12}$ carbonylsiliconaliphatic alkylene and $C_1$-$C_{12}$ siliconaliphatic alkylene. Another example of the second compound is given by structure 3,

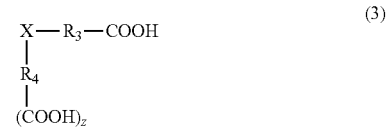

where $R_3$ and $R_4$ are independently selected from $C_1$ to $C_{12}$ aliphatic alkylene, X is a direct valence bond or a connecting group, z is 0, 1, 2 or 3. X may be any organic or silicon organic moiety. X can be a hydrocarbon moiety such as is selected from $C_1$-$C_{12}$ aliphatic alkylene, $C_1$-$C_{12}$ carbonylaliphatic alkylene, $C_1$-$C_{12}$ carbonylsiliconaliphatic alkylene and $C_1$-$C_{12}$ siliconaliphatic alkylene. In one embodiment z is 1, 2 or 3. In one embodiment z is 1. In one embodiment z is 1, X is selected from $C_1$-$C_{12}$ carbonylsiliconaliphatic alkylene and $C_1$-$C_{12}$ siliconaliphatic alkylene, and $R_3$ and $R_4$ are independently selected from $C_1$ to $C_{12}$ aliphatic alkylene.

The second compound may be exemplified by but not limited to formic acid, acetic acid, propionic acid, (trimethylsilyl)acetic acid, butyric acid, valeric acid, isobutyric acid, oxalic acid, malonic acid, methylmalonic acid, ethylmalonic acid, succinic acid, adipic acid, glutaric acid, maleic acid, . . . , polyacrylic acid polymethacrylic acid etc. Further examples of the second compound comprising silicon and carboxylic acid groups are 1,3-bis(3-carboxypropyl)tetramethyldisiloxane, 1,3-bis(3-carboxypropyl)tetraethyldisiloxane, 1,3-bis(2-carboxyethyl)tetramethyldisiloxane, 1,3-bis (2-carboxyethyl)tetraethyldisiloxane, 1,3-bis(carboxymethyl)tetramethyldisiloxane, 1,3-bis(carboxymethyl)tetraethyldisiloxane, (3-carboxypropyl) terminated polydimethylsiloxane, (3-carboxypropyl) terminated polydiethylsiloxane, (2-carboxyethyl) terminated polydimethylsiloxane, (2-carboxyethyl) terminated polydiethylsiloxane, (carboxymethyl) terminated polydimethylsiloxane and (carboxymethyl) terminated polydiethylsiloxane.

In one embodiment of the novel composition, the composition comprises a first compound containing at least a silicon moiety and at least an aliphatic alkyl primary amine (—$NH_2$), and a second compound comprising at least 2 carboxylic acid groups. The composition is an aqueous solution where both the first and second compounds are individually water soluble or together become soluble in the aqueous solution.

In another embodiment of the novel composition the composition comprises a first compound containing at least a silicon moiety and an aliphatic alkyl primary amine, and a second siloxane (SiOSi) compound comprising 2 carboxylic acid groups. The composition is an aqueous solution where both the first and second compounds are soluble in the aqueous solution or become soluble in the aqueous solution.

Examples of the first compound are poly(aminomethylsiloxane), poly(2-aminoethylsiloxane) and poly(3-aminopropylsiloxane).

Examples of the second compound are formic acid, acetic acid, propionic acid, (trimethylsilyl)acetic acid, butyric acid, valeric acid, isobutyric acid, oxalic acid, malonic acid, methylmalonic acid, ethylmalonic acid, succinic acid, adipic acid, glutaric acid, maleic acid, etc. Further examples are polyacrylic acid polymethacrylic acid. Further examples of the second compound comprising silicon and carboxylic acid groups are 1,3-bis(3-carboxypropyl)tetramethyldisiloxane, 1,3-bis(3-carboxypropyl)tetraethyldisiloxane, 1,3-bis(2-carboxyethyl)tetramethyldisiloxane, 1,3-bis(2-carboxyethyl)tetraethyldisiloxane, 1,3-bis(carboxymethyl)tetramethyldisiloxane, 1,3-bis(carboxymethyl)tetraethyldisiloxane, (3-carboxypropyl) terminated polydimethylsiloxane, (3-carboxypropyl) terminated polydiethylsiloxane, (2-carboxyethyl) terminated polydimethylsiloxane, (2-carboxyethyl) terminated polydiethylsiloxane, (carboxymethyl) terminated polydimethylsiloxane and (carboxymethyl) terminated polydiethylsiloxane.

The novel composition of the present invention may additionally comprise surfactant(s), which provide the ability to form good films. Examples of the surfactants include, acetylene alcohols, acetylene glycols, polyethoxylates of acetylene alcohols, polyethoxylates of acetylene glycols, and so on. Examples of the acetylene alcohols and acetylene glycols include, for example, 3-methyl-1-butine-3-ol, 3-methyl-1-pentine-3-ol, 3,6-dimethyl-4-octine-3,6-diol, 2,4,7,9-tetramethyl-5-decine-4,7-diol, 3,5-dimethyl-1-hexine-3-ol, 2,5-dimethyl-3-hexine-2,5-diol, 2,5-dimethyl-2,5-hexanediol, and so on. The surfactants may be used singularly or in a mixture of at least two thereof. A blending amount thereof is usually 50 to 2,000 ppm and preferably 100 to 1,000 ppm relative to the total composition weight of the invention. More examples of suitable surfactants that can be used are Surfynol® 485 available from Air Products (Air Products and Chemicals, Inc., Allentown, Pa., USA), Megaface® Exp TF2066, Megaface® F-553 available from DIC (DIC Corporation, Tokyo, Japan), DBE-712 available from Gelest (Gelest Corp., Morrisville, Pa., USA).

The ratio of the second compound to the first compound in the composition can affect the performance of the coating. In general, higher ratio gives lower attachment over the photoresist pattern surface. The relative loading of the second compound and the first compound may be more precisely defined by a molar ratio of COOH group in the second compound to amino group in the first compound. The molar ratio of COOH group to amino group may range from 1:20 to 3:2 or 1:20 to 11:10, or 1:5 to 1:1. For applications where a thick attached layer is desired, a lower ratio is preferred, where the amino group is free for attachment. For forming a doped photoresist layer, a higher ratio is preferred, where the amino group is substantially neutralized.

The silicon content of the novel composition can be greater than 5 weight % of the solids, or greater than 10 weight % of the solids, or greater than 15 weight % of the solids, or greater than 20 weight % of the solids of the composition.

Alkyl means linear, branched or cyclic alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-, iso, or tert-butyl, linear or branched pentyl, hexyl, heptyl, octyl, decyl, dodecyl, tetradecyl and hexadecyl. Unless otherwise stated, alkyl refers to 1-10 carbon atom moiety. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_6$)alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[5.2.1.0.$^{2,6}$]decane.

In the embodiment where the first compound is a polymer, the weight average molecular weight, Mw, of the polymer of the first compound ranges from approximately 500 to 30,000, or from 800 to 10,000, or from 1,000 to 8,000.

The novel composition comprises a first compound and a second compound as described herein, where the first compound concentration is in the range from about 1% to about 50% by weight, or 2% to 10% by weight, or 4% to 8% by weight, depending on the physical parameters of the compounds and the different chemical compositions of the compounds. Additives and/or other solvents that are miscible with water may be added to the composition. The hydrolysis byproducts during preparation of the first compound are normally alcohols. Such alcohols can remain in the composition as co-solvents. Solvents such as alcohols, particularly, ethanol and isopropanol, may be added.

Photoresist compositions comprise a polymer, a photoactive compound and solvent. Photoresists that are particularly suitable are those which contain polymers with functionalities that can react with the amino group of the novel coating polymer. Although not wishing to be bound by theory, it is believed that the amino group reacts with functional groups to bond with the photoresist polymer and form an interface layer, which stabilizes the photoresist pattern and also increases the overall dimensions of the photoresist. Typically, photoresist polymers containing groups such as carboxylic acids, lactones, anhydrides, and esters are preferred, and such polymers are most often used for photoresists useful for imaging at 193 nm and 157 nm. Photoresist polymers containing functional groups such as carboxylic acids, lactones, anhydrides, esters and photoresist systems are described in the following patents and incorporated herein by reference US 2001/0044070, U.S. Pat. No. 5,843,624, U.S. Pat. No. 6,147,249, and U.S. Pat. No. 6,447,980. Specifically, US 2001/0044070, describes monomeric units containing various types of lactone groups which can form part of a photoresist polymer, more specifically acrylate lactones.

Photoresist polymers comprising anhydride groups may be those exemplified by maleic anhydride and fumaric anhydride.

Photoresist polymers comprising at least one unit with an ester group are exemplified by alkyl esters or alicyclic esters, preferably tertiary esters, such as tertiary butyl esters, 2-alkyl-2-adamantyl esters, 2-methyl-2adamantyl esters, 2-ethyl-2-adamantyl esters, etc.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

The cyclo olefin is incorporated into the backbone of the polymer and may be any substituted or unsubstituted multicyclic hydrocarbon containing an unsaturated bond. The polymer may be synthesized from one or more cyclo olefin monomers having an unsaturated bond. The cyclo olefin monomers may be substituted or unsubstituted norbornene, or tetracyclododecne. The substituents on the cyclo olefin may be aliphatic or cycloaliphatic alkyls, esters, acids, hydroxyl, nitrile or alkyl derivatives. The cyclo olefin monomer may be selected from t-butyl norbornene carboxylate (BNC), hydroxyethyl norbornene carboxylate (HNC), norbornene carboxylic acid (NC), t-butyl tetracyclo[4.4.0.1.$^{2,6}$1.$^{7,10}$]dodec-8-ene-3-carboxylate, and t-butoxycarbonylmethyl tetracyclo[4.4.0.1.$^{2,6}$1.$^{7,10}$]dodec-8-ene-3-carboxylate; more preferably the cyclo olefins are selected from t-butyl norbornene carboxylate (BNC), hydroxyethyl norbornene carboxylate (HNC), and norbornene carboxylic acid (NC).

The preferred acrylate monomers may be selected from mevaloniclactone methacrylate (MLMA), mevaloniclactone acrylate (MLA), 2-methyladamantyl methacrylate (MAdMA), 2-methyladamantyl acrylate (MAdA), 2-ethyladamantyl methacrylate (EAdMA), 2-ethyladamantyl acrylate (EAdA), isobornyl methacrylate, isobornyl acrylate, 3-hydroxy-1-methacryloxyadamatane, 3-hydroxy-1-acryloxyadamatane, 3,5-dihydroxy-1-methacryloxyadamantane, 3,5-dihydroxy-1-acryloxyadamantane, β-methacryloxy-γ-butyrolactone, β-acryloxy-γ-butyrolactone, α-methacryloxy-γ-butyrolactone, α-acryloxy-γ-butyrolactone norbornenelactone methacrylate, norbornenelactone acrylate. More preferably the acrylate monomers are selected from mevaloniclactone methacrylate (MLMA), mevaloniclactone acrylate (MLA), 2-methyladamantyl methacrylate (MAdMA), 2-methyladamantyl acrylate (MAdA), 2-ethyladamantyl methacrylate (EAdMA), 2-ethyladamantyl acrylate (EAdA), 3-hydroxy-1-methacryloxyadamatane, 3-hydroxy-1-acryloxyadamatane, α-methacryloxy-γ-butyrolactone, α-acryloxy-γ-butyrolactone norbornenelactone methacrylate, norbornenelactone acrylate. The cyclic anhydride is preferably maleic anhydride.

Examples of photoresist polymers are poly(2-methyl-2-adamantyl methacrylate-co-beta-butyrolactone methacrylate), poly(2-methyl-2-adamantyl acrylate-co-beta-butyrolactone methacrylate), poly(2-methyl-2-adamantyl methacrylate-co-mevalonic lactone methacrylate), poly(2-methyl-2-adamantyl methacrylate-co-norbornene lactone (meth)acrylate), poly(2-methyl-2-adamantyl methacrylate-co-3-hydroxy-1-adamantyl methacrylate-co-beta-butyrolactone methacrylate), poly(2-methyl-2-adamantyl methacrylate-co-3-hydroxy-1-adamantyl methacrylate-co-alpha-butyrolactone methacrylate), poly(2-methyl-2-adamantyl methacrylate-co-3-hydroxy-1-adamantyl acrylate-co-beta-butyrolactone acrylate), poly(2-methyl-2-adamantyl methacrylate-co-3-hydroxy-1-adamantyl methacrylate-co-norbornene lactone methacrylate), poly(norbonyl methacrylate-co-3-hydroxy-1-adamantyl methacrylate-co-beta-butyrolactone methacrylate), poly(2-ethyl-2-adamantyl methacrylate-co-3-hydroxy-1-adamantyl methacrylate-co-norbornene lactone methacrylate), poly(2-ethyl-2-adamantyl methacrylate-co-3-hydroxy-1-adamantyl acrylate-co-beta-butyrolactone acrylate), poly(2-ethyl-2-adamantyl methacrylate-co-3-hydroxy-1-adamantyl methacrylate-co-alpha-butyrolactone methacrylate), poly(2-methyl-2-adamantyl methacrylate-co-2-ethyl-2-adamantyl methacrylate-co-3-hydroxy-1-adamantyl methacrylate-co-norbornene lactone methacrylate), poly(2-methyl-2-adamantyl methacrylate-co-2-ethyl-2-adamantyl methacrylate-co-3-hydroxy-1-adamantyl methacrylate-co-beta-butyrolactone methacrylate), poly(2-methyl-2-adamantyl methacrylate-co-2-ethyl-2-adamantyl methacrylate-co-3-hydroxy-1-adamantyl methacrylate-co-alpha-butyrolactone methacrylate), poly(2-methyl-2-adamantyl methacrylate-co-3-hydroxy-1-adamantyl methacrylate-co-beta-butyrolactone methacrylate-co-norbornene lactone methacrylate) poly(2-methyl-2-adamantyl methacrylate-co-beta-butyrolactone methacrylate-co-norbornene lactone methacrylate).

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al., "Advances in Resist Technology and Processing XIX", Proceedings of SPIE Vol. 4690, pg. 76, 2002; U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

Particularly preferred for 193 nm and 157 nm exposure are photoresists comprising non-aromatic polymers, a photoacid generator, optionally a solubility inhibitor, optionally a base, and solvent.

The photoacid generator (PAG) of the photoresist composition is selected from those which absorb at the desired exposure wavelength, preferably 193 nm and 157 nm. Suitable examples of the acid generating photosensitive compounds include, without limitation, ionic photoacid generators (PAG), such as diazonium salts, iodonium salts, sulfonium salts, or non-ionic. PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (e.g. $CF_3CO_2^-$) or nucleophilic acids (e.g. $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo[4.3.0]-5-nonene, 1,8-diazabicyclo[5,4,0]-7-undecene, cyclic alkylamines, or polyether bearing amines such as described in U.S. Pat. No. 6,274,286.

The photoresist composition for 193 nm and 157 nm imaging are typically formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono-alkyl ether, propylene glycol alkyl ether acetate, butyl acetate, xylene, 1,3-di(trifluoromethyl)benzene, ethylene glycol monoethyl ether acetate, propylene glycol monomethyl ether acetate, 2-heptanone, ethyl lactate, ethyl-3-ethoxypropionate, and mixtures of ethyl lactate and ethyl-3-ethoxypropionate, among others.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc. nanoimprinting may also be used to form a pattern.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The photoresist is coated on the substrate, image wise exposed with appropriate radiation to which the photoresist is sensitive, baked and developed, according to processes well known in the art.

The novel material of the present invention is then coated over the photoresist and reacted with the photoresist to form an intermixed and/or attached intermixed layer after the unreacted composition material is removed by removal solution. The thickness of the intermixed and/or attached layer can range from about 2 nm to about 150 nm, preferably 5 nm to 30 nm and more preferably 10 nm to 30 nm. Similarly, the novel coating is used to dope the photoresist pattern surface. The reaction between the coating material and the photoresist typically occurs during a heating step but may also take place at room temperature. The coating material may be heated between 75° C. to about 250° C., or about 80° C. to about 160° C., or 110 C to 140° C. for 30 seconds to 180 seconds on a hotplate. Heating the novel material at temperature around 90° C. or around 110° C. should not cure the film of the novel material, since any curing of the entire film would not allow it to be removed with the removal solution.

The residual portion of the novel material that is not reacted is removed using, a removal solution. The removal solution may be water or comprises an aqueous solution of a surfactant, which may further comprise an alkali and/or a water-miscible solvent. Examples of an alkali are tetramethyl ammonium hydroxide, tetraethyl ammonium hydroxide, choline or mixtures thereof. Water-miscible solvents are, for example, lower aliphatic alcohols such as ethanol or isopropanol; multifunctional alcohols such as ethylene glycol, propylene glycol, glycerol, or their monomethyl ethers, in particular propylene glycol monomethyl ether (PGME). Water-soluble nonionic surfactants and anionic surfactants were found to provide good lithographic results. Examples of nonionic surfactants are ethylene oxide/propylene oxide polymers, terminated by alkyl, fluoroalkyl, or aromatic groups. Anionic surfactants also gave superior lithographic performance, and examples of such surfactants are, salts of longer-chain alkanoic acids, such as laurates, stearates, or heptanoates, salts of alkyl or aralkyl sulfonic acids, such as laurylsulfonic acid, or variously substituted salts of sulfonic acid amides, or the partially or completely fluorinated derivatives of the above classes of compounds. Ammonium, tetramethyl ammonium, tetraethyl ammonium, or other alkyl ammonium ions are useful counter ions. The actual composition of the removal solution is dependent on factors such as, the shrink material, the desired lithographic performance, compatibility of materials, production specifications, etc.

The removal solution is applied on the surface of the substrate in a manner known in the art. Puddle development, immersion development, spray development or any mixtures of these techniques may be used to remove chemical compositions from the substrate. The time and temperature of the removal process is varied to give the best lithographic properties. Desirable lithographic properties being, for example, (a) cleanliness of the substrate after removal of the unreacted novel material, that is, the substrate is free from insoluble deposits, stringers, bridges, etc, (b) vertical wall angles, and (c) smooth surfaces.

Once the desired narrow space is formed as defined by the process described above, the device may be further processed as required. Metals may be deposited in the space, the substrate may be etched, the photoresist may be planarized, etc.

In another embodiment the novel material is used to dope the photoresist pattern as shown in FIG. 5A to 5D, where the novel coated film formed over the photoresist pattern is heated to diffuse the silicon into the photoresist and the layer is then removed with a removal solution as described herein. An intermixed doped layer is formed on the surface of the photoresist pattern as described previously.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Example 1

Synthesis of poly(3-aminopropylsiloxane): 123.9 g of DI water was charged in a 500 ml flask with a magnetic stirring bar. Under stirring, 51.48 g of 3-aminopropyltriethoxysilane was added dropwise. After addition, the solution was stirred at room temperature for 18 hrs to obtain a clear solution. GPC showed a MW of about 1060 g/mol.

Formulation: A 5.0 wt % solution was prepared by diluting the above polymer solution with DI water and 1000 ppm Surfynol® 485 surfactant (available from Air Products and Chemicals, Inc., Allentown, Pa., USA) was added.

Test: the formulation was spin-coated on 6-in Si wafer and baked at 110° C./30 s. Then the wafers were developed by DI water for 30 s. The baked film remained after water development, showing that the film was cured and was not able to be removed by DI water.

Example 2

Synthesis: 13.42 g of 1,3-bis(3-carboxypropyl)tetramethyldisiloxane was dispersed in 34.3 g of DI water. Under stirring, 19.38 g of 3-aminopropyltriethoxysilane was added dropwise. After addition, the solution was stirred at room temperature for 24 hrs to obtain a clear solution. GPC showed a MW of about 1200 g/mol. The molar ratio of COON in 1,3-bis(3-carboxypropyl)tetramethyldisiloxane to $NH_2$ in 3-aminopropyltriethoxysilane was 100:100.

Formulation: A 5.0 wt % solution was prepared by diluting the above polymer solution with DI water and 1000 ppm Surfynol® 485 surfactant (available from Air Products and Chemicals, Inc., Allentown, Pa., USA) was added.

Test: the formulation was spin-coated on 6-in Si wafer and baked at 110° C./60 s. Then the wafers were developed by DI water for 30 s. The baked film was completely washed away by DI water, showing that 1,3-bis(3-carboxypropyl)tetramethyldisiloxane prevented poly(3-aminopropylsiloxane) from curing at 110° C./60 s baking.

Example 3

Formulation: 20.4 g of the polymer solution in Example 2 and 30.13 g of the polymer solution in Example 1 were mixed with 163.7 g of DI water. Then 500 ppm Megaface® Exp TF-2066 surfactant available from DIC Corporation (Tokyo, Japan) was added and the formulation was filtered through 0.2 μm filter. The molar ratio of COOH in 1,3-bis(3-carboxypropyl)tetramethyldisiloxane to total $NH_2$ in 3-aminopropyltriethoxysilane was 40:100.

Test 1: The formulation was spin-coated on separate 8-in Si wafer and one wafer was baked at 110° C./60 s and another wafer was baked at 140° C./60 s. Then the wafers were developed by DI water for 30 s. In both cases, the baked films were completely washed away showing no curing.

Test 2: 90 nm line/trench patterns with 1:1 pitch were generated on separate 8-inch silicon wafers using a 193 nm photoresist (AZ®2110P, AZ Electronic Materials Corp., Somerville, N.J., USA). The above formulation was coated over the pattern at 1800 rpm, and one wafer was baked at 110° C./60 s and the second wafer was baked at 140° C./60 seconds, followed by water development for 30 seconds. CD measurement showed about 15 nm CD increase in the photoresist linewidth, showing the formation of an attached layer.

Test 3: The above formulation was spin-coated at 1500 rpm on 8-ich silicon wafer and the film was baked at 200° C. for 60 seconds. The wafer was etched in pure $O_2$ plasma using the following conditions: $O_2$ flow rate of 50 sccm; process pressure of: 0.26 Pa; antenna power of 100 w; trigger power of 100 w; and, process time of 15 sec. A relative etch rate of 0.08 was obtained for this material versus AZ®2110P 193 nm photoresist as reference, indicating that this material had high etch selectivity relative to photoresist.

Example 4

Synthesis: 9.26 g of 1,3-bis(3-carboxypropyl)tetramethyldisiloxane was dispersed in 37.86 g of DI water. Under stirring, 33.4 g of 3-aminopropyltriethoxysilane was added dropwise. After addition, the solution was stirred at room temperature for 24 hrs to obtain a clear solution. GPC showed a MW of 1256 g/mol. The molar ratio of COOH in 1,3-bis(3-carboxypropyl)tetramethyldisiloxane to $NH_2$ in 3-aminopropyltriethoxysilane was 40:100.

Formulation: 5.28 g of the above polymer solution was diluted by DI water to a total weight of 31 g and 500 ppm Megaface® Exp TF-2066 surfactant available from DIC Corporation (Tokyo, Japan) was added. The solution was filtered through 0.2 μm filter.

Test 1: The formulation was spin-coated on 8-in Si wafers and baked at 110° C./60 s. Then the wafers were developed by DI water for 30 s. The baked film was completely washed away, showing no curing at 110° C./60 s baking.

Test 2: 90 nm line/trench patterns with 1:1 pitch were generated on 8-inch silicon wafer using a ArF photoresist (AZ®2110P, AZ Electronic Materials Corp., Somerville, N.J., USA). The above composition was coated over the pattern at 1800 rpm, baked at 110° C. for 60 seconds, followed by water development for 30 seconds. CD measurement showed about 15 nm CD increase in the photoresist linewidth, showing the formation of an attached layer.

Example 5

Synthesis: 21.39 g of 1,3-bis(3-carboxypropyl)tetramethyldisiloxane was dispersed in 87.56 g of DI water. Under stirring, 77.24 g of 3-aminopropyltriethoxysilane was added dropwise. After adding another 9.1 g of DI water, the solution was stirred at room temperature for 24 hrs to obtain a clear solution. GPC showed a MW of 1162 g/mol. The molar ratio of COOH in 1,3-bis(3-carboxypropyl)tetramethyldisiloxane to $NH_2$ in 3-aminopropyltriethoxysilane was 40:100.

Formulation: 37.7 g of the above polymer solution was diluted by DI water to a total weight of 240 g and 500 ppm Megaface® Exp TF-2066 surfactant available from DIC Corporation (Tokyo, Japan) was added. The solution was filtered through 0.2 μm filter.

Test: 120 nm contact holes with different pitches were generated on 8-inch silicon wafer using a ArF contact hole photoresist (AZ®2050, AZ Electronic Materials Corp., Somerville, N.J., USA). The above aqueous silicon composition was coated over the pattern at 1800 rpm, baked at 110° C. for 60 seconds, followed by water development for 30 seconds. CD measurement showed about 20 nm decrease in the contact hole diameter.

Example 6

Synthesis: 5.0 g of 1,3-bis(3-carboxypropyl)tetramethyldisiloxane was dispersed in 25 g of DI water. Under stirring, a mixture of 18.06 g of 3-aminopropyltriethoxysilane and 1 g of tetraethoxysilane was added dropwise. After addition, the solution was stirred at room temperature for 24 hrs to obtain a clear solution. The molar ratio of COON in 1,3-bis(3-carboxypropyl)tetramethyldisiloxane to $NH_2$ in 3-aminopropyltriethoxysilane was 40:100. GPC showed a MW of 1207 g/mol.

Formulation: 8.2 g of the above polymer solution was diluted by 44.6 g of DI water and 500 ppm Megaface® Exp TF-2066 surfactant available from DIC Corporation (Tokyo, Japan) was added. The solution was filtered through 0.2 μm filter.

Test 1: The formulation was spin-coated on 8-in Si wafer and baked at 110° C./60 s. Then the wafers were developed by DI water for 30 s. The baked film was completely washed away, showing no curing.

Test 2: first 90 nm line/trench patterns with 1:1 pitch were generated on 8-inch silicon wafer using an ArF (193 nm) photoresist (AZ®2110P, AZ Electronic Materials Corp., Somerville, N.J., USA). The above composition was over-coated at 1800 rpm, baked@110° C. for 60 seconds, followed by water development for 30 seconds. CD measurement showed about 20 nm CD increase.

Example 7

Synthesis: 19.98 g of 1,3-bis(3-carboxypropyl)tetramethyldisiloxane was dispersed in 45.25 g of DI water. Under stirring, 23.35 g of 3-aminopropyltrimethoxysilane was added dropwise. After addition, the reaction solution was stirred for 24 hrs at room temperature to obtain a clear solution. GPC showed a MW of 1200 g/mol. The molar ratio of COON in 1,3-bis(3-carboxypropyl)tetramethyldisiloxane to $NH_2$ in 3-aminopropyltriethoxysilane was 100:100.

Formulation: 2 g of the above polymer solution and 5.18 g of the polymer solution in Example 1 were mixed and diluted with DI water to make 4.7 wt % solution. 500 ppm Megaface® Exp TF-2066 surfactant available from DIC Corporation (Tokyo, Japan) was added and the solution was filtered through 0.2 μm filter. The molar ratio of COOH vs total $NH_2$ in this formulation was 30:100.

Test 1: The formulation was spin-coated on 8-in Si wafer and baked at 110° C./60 s. Then the wafers were developed by DI water for 30 s. The baked film was completely washed away, showing no curing.

Test 2: first 90 nm line/trench patterns with 1:1 pitch were generated on 8-inch silicon wafer using a ArF photoresist (AZ®2110P, AZ Electronic Materials Corp., Somerville, N.J., USA). The above composition was over-coated at 1800 rpm, baked@135° C. for 60 seconds, followed by water development for 30 seconds. CD measurement showed about 37 nm CD increase.

Example 8

Formulation: 13.99 g of the polymer solution in Example 7 was diluted by 100.1 g of DI water and 500 ppm Megaface®

Exp TF-2066 surfactant available from DIC Corporation (Tokyo, Japan) was added. The solution was filtered through 0.2 μm filter. The molar ratio of COOH vs NH$_2$ in this formulation was 100:100.

Test 2: first 80 nm line/trench patterns with 1:1 pitch were generated on 8-inch silicon wafer using a ArF photoresist (AZ®2110P, AZ Electronic Materials Corp., Somerville, N.J., USA). The above composition was over-coated at 1800 rpm/30 s, baked@140° C. for 60 seconds, developed by 2.38 wt % TMAH developer for 30 seconds. CD measurement showed no CD change. The same wafer was then immersed in a photoresist solvent for 60 seconds. X-SEM showed that the patterns on the wafer did not disappear. This indicated that the silicon composition diffused into the photoresist and protected the photoresist patterns from solvent erosion even after the attached silicon layer was removed by TMAH removal solution.

Example 9

Formulation: a 5 wt % aqueous solution was prepared by mixing oligomeric poly(3-aminopropylsiloxane) solution (22-25 wt % aqueous solution, MW: 570 g/mol, Gelest Corp., Morrisville, Pa., USA) with DI water. 1000 ppm Surfynol® 485 surfactant (available from Air Products and Chemicals, Inc., Allentown, Pa., USA) was added.

Test: the formulation was spin-coated on 6-in Si wafer and baked at 110° C./30 s. Then the wafers were developed by DI water for 30 s. The baked film remained after water development, showing that the film was cured and was not able to be removed by DI water.

Example 10

2.27 g of adipic acid was dissolved in 16.57 g of 22-25 wt % aqueous solution of poly(3-aminopropylsiloxane) obtained from Gelest (Gelest Corp., Morrisville, Pa., USA). 1.5 g of this mixture was diluted by DI water to a total weight of 8.3 g. 500 ppm Megaface® Exp TF-2066 surfactant available from DIC Corporation (Tokyo, Japan) was added and the solution was filtered through 0.2 μm filter.

The formulation was spin-coated on 8-in Si wafer and baked at 110° C./60 s. Then the wafers were developed by DI water for 30 s. The baked film was completely washed away, showing that adipic acid was able to prevent poly(3-aminopropylsiloxane) from curing at this temperature.

Example 11

Synthesis: 40.56 g of DI water was charged in a 250 ml flask with a magnetic stirring bar. Under stirring, 19.8 g of N-[3-(trimethoxysilyl)propyl]ethylenediamine was added dropwise. After addition, the solution was stirred at room temperature for 19 hrs to obtain a clear solution.

Formulation: a 5.0 wt % solution was prepared by diluting the above polymer solution with DI water and 500 ppm Megaface® Exp TF-2066 surfactant available from DIC Corporation (Tokyo, Japan) was added.

Test: the formulation was spin-coated on 6-in Si wafer and baked at 110° C./30 s. Then the wafers were developed by DI water for 30 s. The baked film remained after water development, showing that the film was cured and was not able to be removed by DI water.

Example 12

Synthesis: 7.3 g of adipic acid was dispersed in 40.17 g of DI water in a 250 ml flask with a magnetic stirring bar. Under stirring, 11.18 g of N-[3-(trimethoxysilyl)propyl]ethylenediamine was added dropwise. After addition, the solution was stirred at room temperature for 19 hrs to obtain a clear solution.

The molar ratio of COOH in adipic acid to a total N in N-[3-(trimethoxysilyl)propyl]ethylenediamine was 100:100.

Formulation: A 5.0 wt % solution was prepared by diluting the above polymer solution with DI water and 500 ppm Megaface® Exp TF-2066 surfactant available from DIC Corporation (Tokyo, Japan) was added.

Test: the formulation was spin-coated on 6-in Si wafer and baked at 140° C./60 s. Then the wafers were developed by DI water for 30 s. The baked film was completely washed away by DI water, showing that adipic acid prevented poly(propylethylenediaminesiloxane) from curing at 140° C./60 s baking.

The invention claimed is:

1. An aqueous composition for coating over a photoresist pattern comprising a first water soluble compound comprising at least a silicon moiety and at least one amino group, and a second compound comprising at least 2 carboxylic acid group where the composition is capable of forming a conformal attached layer to the photoresist in which the amino groups of the conformal layer reacts with the surface of the photoresist to form an interface attached layer which is insoluble in an aqueous removing solution and further were the photoresist pattern contains groups chosen from the group comprising carboxylic acid, lactones, anhydrides and esters, and further were the unreacted, portion of the coating is removed with the aqueous removing solution and further wherein the first compound comprises an oligomer or polymer of siloxane (Si—O) or silane (Si—Si) moieties which further comprise a functional group of structure 1,

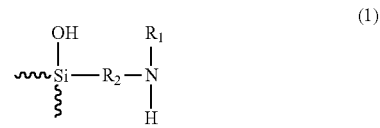

where R$_1$ is selected from hydrogen, C$_1$-C$_8$ alkyl, and C$_1$-C$_6$ carbonylalkyl, R$_2$ is selected from C$_1$-C$_{12}$ aliphatic alkylene, C$_1$-C$_{12}$ carbonylaliphatic alkylene, C$_1$-C$_{12}$ carbonylaminoaliphatic alkylene and C$_1$-C$_{12}$ aminoaliphatic alkylene and ∿∿ is the point of attachment to the residual portion of the first compound.

2. The composition of claim 1, where the first compound is a copolymer prepared by copolymerizing an amino containing silane with a non amino containing silane.

3. The composition of claim 1, where the second compound further comprises silicon moiety.

4. The composition of claim 2, where the amino containing silane is chosen from the group consisting of

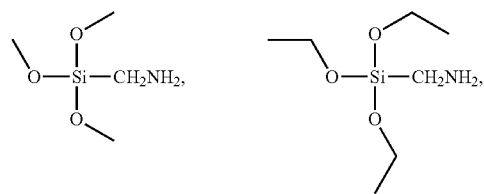

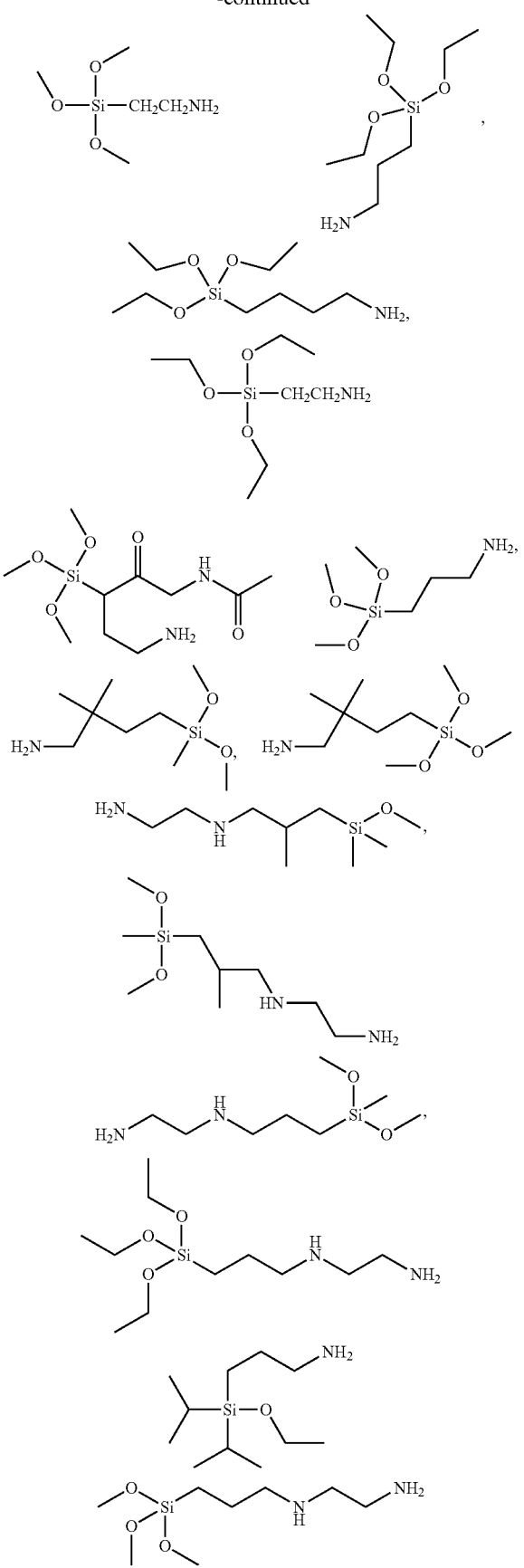
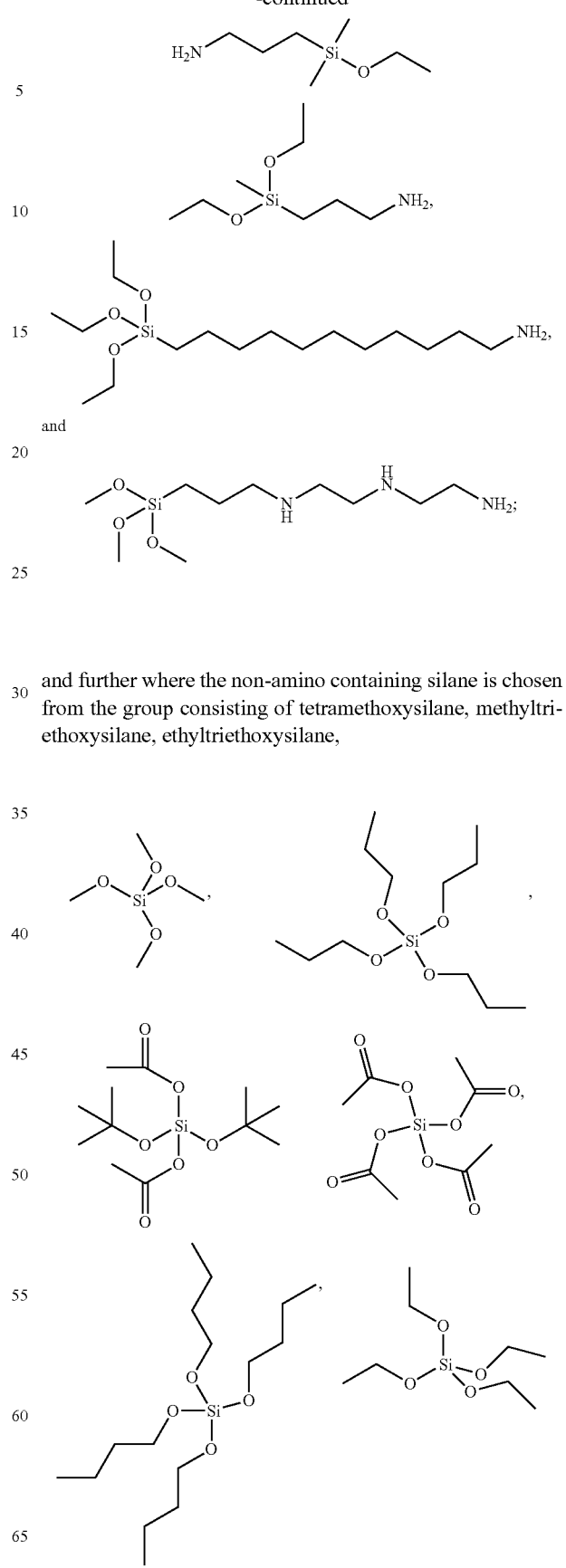
and further where the non-amino containing silane is chosen from the group consisting of tetramethoxysilane, methyltriethoxysilane, ethyltriethoxysilane, -continued

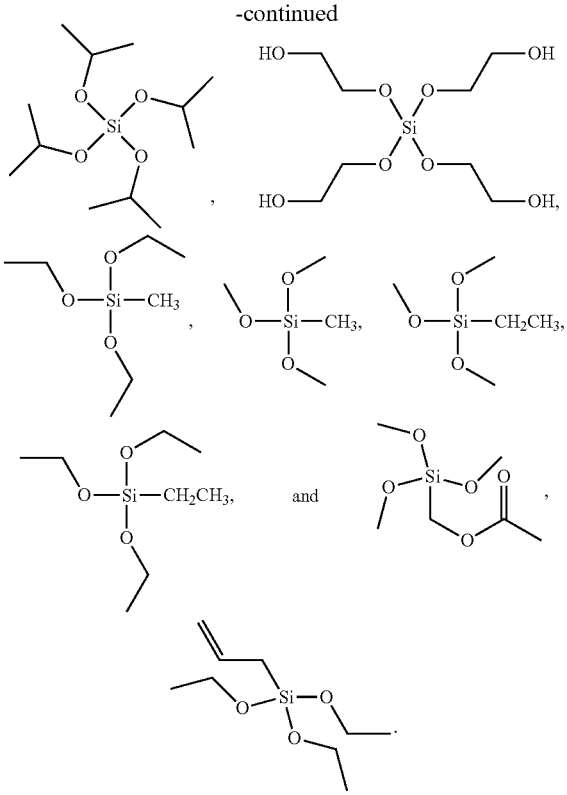

5. The composition of claim 1, where the second compound has structure 2,

where W is a connecting group and y is 1, 2 or 3.

6. The composition of claim 1, where the second compound has structure 3,

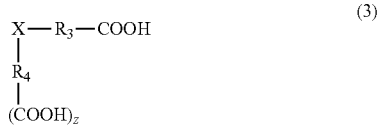

where $R_3$ and $R_4$ are independently selected from $C_1$ to $C_{12}$ aliphatic alkylene, X is a direct valence bond or a connecting group, z is 1, 2 or 3.

7. The composition of claim 2, where the second compound has structure 3,

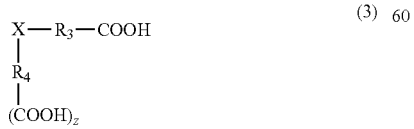

where $R_3$ and $R_4$ are independently selected from $C_1$ to $C_{12}$ aliphatic alkylene, X is a direct valence bond or a connecting group, z is 1, 2 or 3.

8. The composition of claim 7, where X comprises a silicon moiety.

9. The composition of claim 1, where molar ratio of the carboxylic acid group in the second compound to the amine group of the first compound is in the range of about 5:100 to about 110:100.

10. The composition of claim 1, capable of being developed in water or an aqueous alkaline solution after baking at 90° C. for 60 seconds.

11. The composition of claim 1 further comprising a solvent selected from water, water-soluble organic solvent, or a mixture thereof.

12. The composition of claim 1, where the silicon content of the composition is greater than 5 weight % relative to the solids in the composition.

13. A pattern forming method comprising the steps of
(a) forming a first photoresist pattern on a substrate,
(b) applying a coating composition of claim 1 over the first photoresist pattern to form a second coating layer covering the first photoresist pattern;
(c) optionally heating the coating; and,
(d) developing the second coating composition thereby removing the unreacted second coating layer over the first photoresist pattern.

14. A pattern forming method comprising the steps of
(a) forming a first photoresist pattern with photoresist structures on a substrate,
(b) applying a coating composition of claim 1 over the first photoresist pattern to form a coating layer covering the first photoresist pattern,
(c) developing the coating layer, thereby forming an attached coating layer over the first photoresist pattern;
(d) dry etching the surface of the photoresist to completely remove the attached coating layer on top of the photoresist pattern; and,
(e) removing the first photoresist pattern, thereby forming a pattern of the attached layer on the substrate.

15. The process of claim 14, further comprising a hardbake after forming the attached layer.

16. The process of claim 14, where the first photoresist pattern is removed by dry etching.

17. The process of claim 14, where the first photoresist pattern is removed by an organic solvent.

18. The process of claim 15, where the first photoresist pattern is removed by flood exposure and development in an aqueous alkaline developer.

19. A pattern forming method comprising the steps of
(a) forming a first photoresist pattern on a substrate,
(b) applying a coating composition of claim 1 over the first photoresist pattern to form a coating layer covering the first photoresist pattern;
(c) optionally heating the coating; and,
(d) developing the second coating composition thereby forming an intermixed doped photoresist pattern.

* * * * *